(12) United States Patent
Seif

(10) Patent No.: US 7,315,177 B1
(45) Date of Patent: Jan. 1, 2008

(54) MIXED SIGNAL INTEGRATED CIRCUITS WITH SELF-TEST CAPABILITY

(75) Inventor: Ulrich Seif, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 101 days.

(21) Appl. No.: 10/997,310

(22) Filed: Nov. 22, 2004

(51) Int. Cl.
*G01R 31/02* (2006.01)

(52) U.S. Cl. ..................................... 324/763

(58) Field of Classification Search ............... 324/73.1, 324/763, 158.1, 765; 714/733, 740; 257/48; 365/201; 327/100, 107, 135, 150, 159, 166
See application file for complete search history.

(56) References Cited

U.S. PATENT DOCUMENTS

| | | | |
|---|---|---|---|
| 5,506,851 A * | 4/1996 | Fuse | 714/724 |
| 5,793,778 A * | 8/1998 | Qureshi | 714/727 |
| 6,597,191 B2 * | 7/2003 | Oosawa et al. | 324/763 |
| 6,876,220 B2 * | 4/2005 | Witte | 324/765 |
| 6,925,408 B2 * | 8/2005 | Premy et al. | 702/120 |
| 7,096,386 B2 * | 8/2006 | Ozawa | 714/30 |

* cited by examiner

*Primary Examiner*—Ha Tran Nguyen
*Assistant Examiner*—Roberto Velez
(74) *Attorney, Agent, or Firm*—Vedder, Price, Kaufman & Kammholz, P.C.

(57) ABSTRACT

A mixed signal integrated circuit with self test capability in which a portion of the digital circuitry, during substantially mutually exclusive time intervals, controls self test functions within the analog circuitry and performs digital signal processing functions in conjunction with the remaining portion of the digital circuitry.

32 Claims, 1 Drawing Sheet

MIXED SIGNAL INTEGRATED CIRCUITS WITH SELF-TEST CAPABILITY

BACKGROUND OF THE INVENTION

1. Field of the Invention

The present invention relates to integrated circuits (ICs) having self-test capability, and in particular, to mixed signal (i.e., digital and analog) ICs having self-test capability.

2. Description of the Related Art

As ICs have become increasingly sophisticated and complex (e.g., very large scale integration, or "VLSI"), the concept of design for testability (DFT) has become more important. The current economics of electronics manufacturing require that ICs be of very high quality before they are incorporated into products or systems. Simple functional testing, such as that provided by typical automated test equipment (ATE) is often inadequate. Accordingly, improvements in VLSI technology, e.g., in terms of gate density and increased clock speeds, have caused VLSI testing to become an integral part of the overall chip design. With the increased circuit complexity and higher operating speeds, external test equipment often fails to keep pace, thus preventing test and measurement under normal circuit operating conditions. As a result, built-in-self-test (BIST) has become an increasingly important and useful tool as part of DFT. This is particularly true and important for system-on-a-chip (SOC) designs and mixed signal ICs. In the case of mixed signal ICs, the BIST circuitry typically resides in the digital circuitry portion of the IC so that any performance impacts on the analog circuitry are minimized. However, notwithstanding the advantages of having BIST, as ICs become increasingly complex and dense, the overhead, in terms of additional circuitry associated with BIST becomes a new problem.

Accordingly, it would be desirable to have the advantages of BIST but without the disadvantages of the additional circuitry overhead associated with BIST.

SUMMARY OF THE INVENTION

A mixed signal integrated circuit with self test capability in which a portion of the digital circuitry, during substantially mutually exclusive time intervals, controls self test functions within the analog circuitry and performs digital signal processing functions in conjunction with the remaining portion of the digital circuitry.

A mixed signal integrated circuit with self test capability in accordance with one embodiment of the presently claimed invention includes a plurality of power electrodes, a plurality of input signal electrodes, a plurality of output signal electrodes, digital circuitry and analog circuitry. The plurality of power electrodes is to convey DC power at one or more source voltages. The plurality of input signal electrodes is to convey a plurality of input signals including one or more digital input signals and one or more analog input signals. The plurality of output signal electrodes is to convey a plurality of output signals including one or more digital output signals and one or more analog output signals. The digital circuitry is coupled, at least in part, to the pluralities of power, input signal and output signal electrodes, and responsive, during a plurality of substantially mutually exclusive time intervals, to at least a portion of the plurality of input signals and one or more test signals by selectively processing the at least a portion of the plurality of input signals and the one or more test signals, and selectively providing one or more control signals and at least a portion of the plurality of output signals including one or more result signals related to the one or more test signals. The analog circuitry is coupled, at least in part, to the pluralities of power, input signal and output signal electrodes, and to at least a portion of the digital circuitry, and responsive to at least another portion of the plurality of input signals and the one or more control signals by selectively processing the at least another portion of the plurality of input signals and the one or more control signals and selectively providing at least another portion of the plurality of output signals and the one or more test signals.

A mixed signal integrated circuit with self test capability in accordance with another embodiment of the presently claimed invention includes a plurality of power electrodes, a plurality of input signal electrodes, a plurality of output signal electrodes, digital circuitry and analog circuitry. The plurality of power electrodes is to convey DC power at one or more source voltages. The plurality of input signal electrodes is to convey a plurality of input signals including one or more digital input signals and one or more analog input signals. The plurality of output signal electrodes is to convey a plurality of output signals including one or more digital output signals and one or more analog output signals. The digital circuitry is coupled, at least in part, to the pluralities of power, input signal and output signal electrodes, and responsive to at least a portion of the plurality of input signals and one or more test signals by selectively processing, during a plurality of substantially mutually exclusive time intervals, the at least a portion of the plurality of input signals and the one or more test signals, and selectively providing one or more control signals and at least a portion of the plurality of output signals including one or more result signals related to the one or more test signals. The analog circuitry is coupled, at least in part, to the pluralities of power, input signal and output signal electrodes, and to at least a portion of the digital circuitry, and responsive to at least another portion of the plurality of input signals and the one or more control signals by selectively processing the at least another portion of the plurality of input signals and the one or more control signals and selectively providing at least another portion of the plurality of output signals and the one or more test signals.

A mixed signal integrated circuit with self test capability in accordance with another embodiment of the presently claimed invention includes a plurality of power electrodes, a plurality of input signal electrodes, a plurality of output signal electrodes, digital circuitry and analog circuitry. The plurality of power electrodes is to convey DC power at one or more source voltages. The plurality of input signal electrodes is to convey a plurality of input signals including one or more digital input signals and one or more analog input signals. The plurality of output signal electrodes is to convey a plurality of output signals including one or more digital output signals and one or more analog output signals. The digital circuitry is coupled, at least in part, to the pluralities of power, input signal and output signal electrodes, and responsive to at least a portion of the plurality of input signals and one or more test signals by selectively processing the at least a portion of the plurality of input signals and the one or more test signals, and selectively providing, during a plurality of substantially mutually exclusive time intervals, one or more control signals and at least a portion of the plurality of output signals including one or more result signals related to the one or more test signals. The analog circuitry is coupled, at least in part, to the pluralities of power, input signal and output signal electrodes, and to at least a portion of the digital circuitry, and responsive to at least another portion of the plurality of input signals and the one or more control signals by selectively processing the at least another portion of the plurality of input signals and the one or more control signals and selectively providing at least another portion of the plurality of output signals and the one or more test signals.

A mixed signal integrated circuit with self test capability in accordance with another embodiment of the presently claimed invention includes a plurality of power electrodes, a plurality of input signal electrodes, a plurality of output signal electrodes, digital circuitry and analog circuitry. The plurality of power electrodes is to convey DC power at one or more source voltages. The plurality of input signal electrodes is to convey a plurality of input signals including one or more digital input signals and one or more analog input signals. The plurality of output signal electrodes is to convey a plurality of output signals including one or more digital output signals and one or more analog output signals. The digital circuitry is coupled, at least in part, to the pluralities of power, input signal and output signal electrodes, and responsive to at least a portion of the plurality of input signals and one or more test signals by, during a plurality of substantially mutually exclusive time intervals, selectively processing the at least a portion of the plurality of input signals and the one or more test signals, and selectively providing one or more control signals and at least a portion of the plurality of output signals including one or more result signals related to the one or more test signals. The analog circuitry is coupled, at least in part, to the pluralities of power, input signal and output signal electrodes, and to at least a portion of the digital circuitry, and responsive to at least another portion of the plurality of input signals and the one or more control signals by selectively processing the at least another portion of the plurality of input signals and the one or more control signals and selectively providing at least another portion of the plurality of output signals and the one or more test signals.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
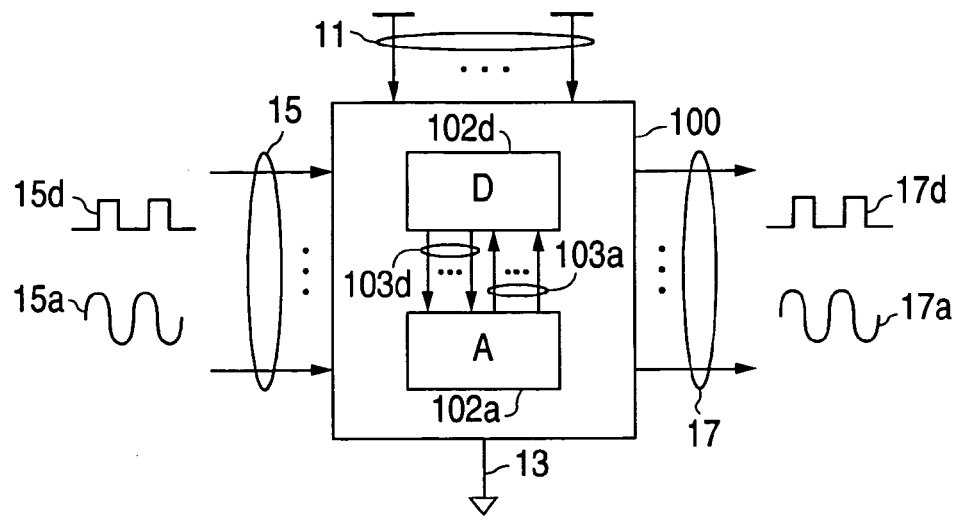
FIG. 1 is a functional block diagram of a mixed signal IC having BIST in accordance with one embodiment of the presently claimed invention.

Referring to FIG. 1, a mixed signal IC 100 with self-test capability in accordance with one embodiment of the presently claimed invention includes power supply electrodes 11, 13 to which one or more sources of DC power are connected. For example, as is well known in the art, it is very common for mixed signal circuits to be implemented using both bipolar and complementary metal oxide semiconductor (CMOS) devices, which often require multiple different power supply voltages, sometimes both positive and negative. This IC 100 also receives a number of input signals 15. Some of these input signals 15 are digital signals 15$d$ while others are analog signals 15$a$. As a result of the various operations and functions performed by this IC 100 using these input signals 15, a number of output signals 17 are provided. Some of these output signals 17 are digital signals 17$d$ while others are analog signals 17$a$.

Internally, this IC 100 is composed of two general forms of circuitry: digital 102$d$ and analog 102$a$. Each of these sections of circuitry 102$d$, 102$a$ receive and process respective ones of the input signals 15 and provide respective ones of the output signals 17. For example, the digital circuitry 102$d$ receives and processes the digital input signals 15$d$ and provides the output digital signal 17$d$. Similarly, the analog circuitry 102$a$ receives and processes the analog input signals 15$a$ and provides the analog output signals 17$a$. Further, these two sections of circuitry 102$d$, 102$a$ interact with each other by providing signals 103$d$ from the digital circuitry 102$d$ to the analog circuitry 102$a$, and providing signals 103$a$ from the analog circuitry 102$a$ to the digital circuitry 102$d$. For purposes of the presently claimed invention, the signals 103$da$ and 103$db$ provided by the digital circuitry 102$d$ can be considered generally as control signals for implementing and otherwise controlling the BIST functions in the analog circuitry 102$a$. The signals 103$a$ provided by the analog circuitry 102$a$ can be considered generally as test signals for conveying to the digital circuitry 102$d$ the results of the BIST functions, or alternatively, as some other form of information representative of the status or results of the BIST functions.

As discussed in more detail below, while the analog circuitry 102$a$ is dedicated to performing its normal analog functions, i.e., processing incoming analog signals 15$a$ to provide outgoing analog signals 17$a$ as well as certain test signals 103$a$ in conformance with the control signals 103$d$, the digital circuitry 102$d$ includes at least two general subsections. One subsection is dedicated to processing one or more of the incoming digital signals 15$d$ to provide one or more of the outgoing digital signals 17$d$. A second subsection performs two general functions during substantially mutually exclusive time intervals: during one time interval this second subsection assists in or performs complementary functions to those performed by the first subsection in processing the incoming digital signals 15$d$ to provide the outgoing digital signals 17$d$. During another time interval, this second subsection is dedicated to initiating, controlling and monitoring the BIST functions performed on or in conjunction with the analog circuitry 102$a$.

Figure 2:
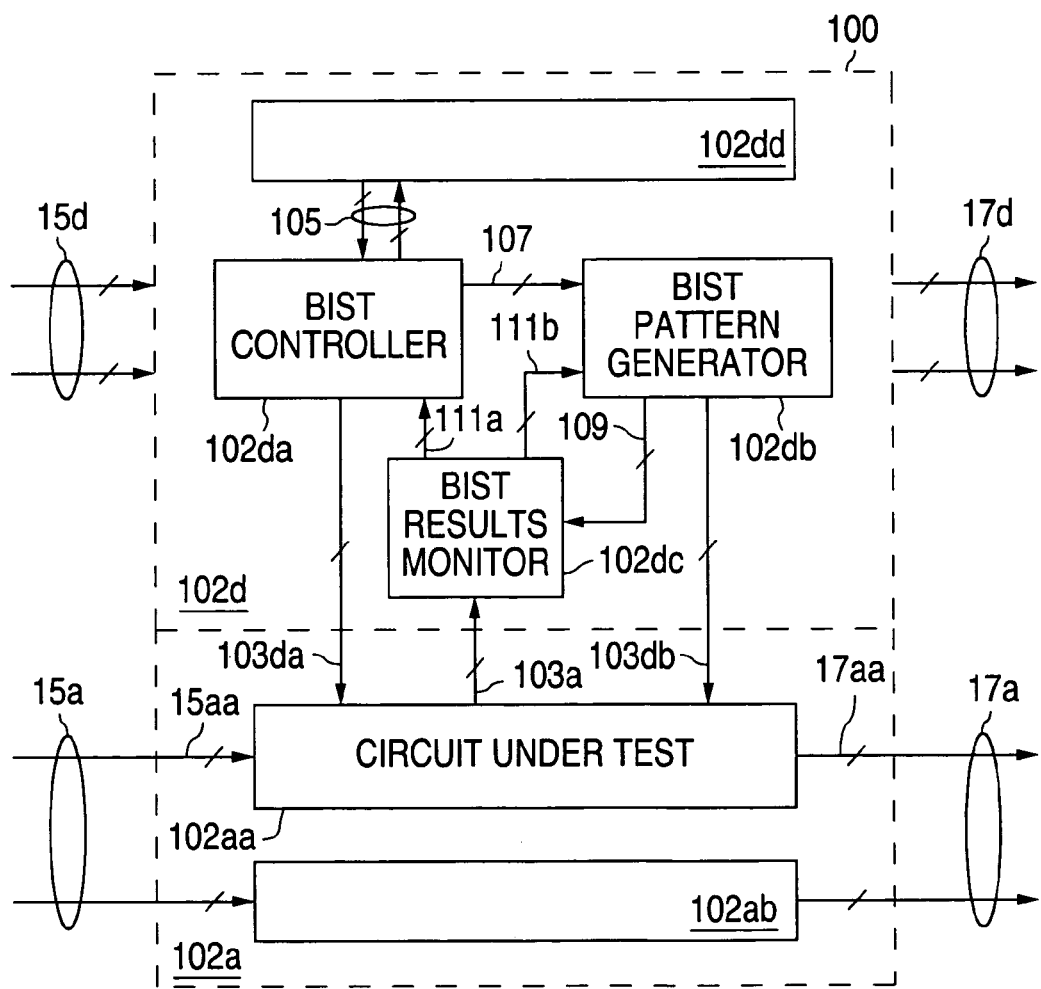
FIG. 2 is a functional block diagram of one embodiment of the IC of FIG. 1.

Referring to FIG. 2, the general designs for architecture of the IC 100 FIG. 1 can be better understood. As discussed above, the analog circuitry 102$a$ includes at least one subsection 102$aa$ which, during the testing time interval, can be considered the "circuit under test". One or more additional subsections 102$ab$ can also be included which need not necessarily be tested under BIST conditions. The digital circuitry 102*d*, as discussed above, includes the subsection 102*dd* which is dedicated to processing incoming digital signals 15*d* and providing outgoing digital signals 17*d* without necessarily having substantial involvement in the BIST functions. Meanwhile, the second subsection includes three basic functional stages which can be described as a BIST controller 102*da*, BIST pattern generator 102*db*, and BIST results monitor 102*dc*, all interconnected substantially as shown. During the BIST interval, as discussed above, these stages 102*da*, 102*dd*, 102*dc* perform the digital functions necessary for the BIST. For example, the BIST controller 102*da* provides control signals 103*da* to the circuit under test 102*aa*, as well as control signals 107 to the BIST pattern generator 102*db*. The control signals 103*da* to the circuit under test 102*aa* are used to control those portions of the circuit under test 102*aa* such that the desired functions and stages of the circuit under test 102*aa* process the appropriate input signals 15*aa*, 103*db* so as to provide the desired test signals 103*a*. The control signals 107 to the BIST pattern generator 102*db* are used to instruct or otherwise control the BIST pattern generator 102*db* such that the appropriate test patterns signals 103*db*, e.g., in the form of various stimulus signals for the circuit under test 102*aa*, are provided as needed.

In response to all of this, the circuit under test 102*aa* provides the test signals 103*a* to the BIST results monitor 102*de*. The BIST results monitor 102*de* processes these test signals 103*a* to provide corresponding result signals 111*a* to the BIST controller 102*da*. Additionally, the BIST pattern generator 102*db* and BIST results monitor 102*de* can exchange signals 109, 111*b* associated with the BIST operations as needed, e.g., to provide real-time control of the test pattern signals 103*db* or corresponding test pattern data 109*a* tot the BIST results monitor 102*de* for comparison with the test signals 103*a*. The BIST controller 102*da* also exchanges signals 105 with the remaining digital circuitry 102*dd* as needed, e.g., for testing a portion of the remaining digital circuitry 102*dd* during BIST operations, or providing data concerning the results of the BIST operations upon the circuit under test 102*aa*.

As will be readily understood by one of ordinary skill in the art, the BIST controller 102*da*, BIST pattern generator 102*db* and BIST results monitor 102*dc* functions can be implemented in any of a number of well known ways. For example, the BIST controller 102*da* function can be performed by a microcontroller or a portion of a microprocessor, both of which, during non-BIST time intervals, perform other digital signal processing functions in conjunction with the dedicated digital circuitry 102*dd*. Similarly, the BIST results monitor 102*dc* can be circuitry which, during non-BIST time intervals, performs other types of signal interface functions between the analog circuitry 102*a* and digital circuitry 102*d* (e.g., analog-to-digital signal conversion). The BIST pattern generator 102*db* can be implemented using various forms of memory or configurable logic circuitry, such as read only memory, programmable read only memory, a programmable logic array, a field programmable logic array, programmable array logic, field programmable array logic, or a multi-level gate array. Further, the BIST pattern generator 102*db* can be implemented to perform a number of different forms of BIST functions. For example, in accordance with well known BIST techniques, the BIST pattern generator 102*db* can be implemented to provide for exhaustive testing, pseudorandom testing or pseudoexhaustive testing. In the case of exhaustive testing, exhaustive test pattern generators can be implemented, while in the case of pseudoexhaustive testing, weighted and adaptive test generators can be implemented. In the case of pseudoexhaustive testing, various combinations of counters, linear feedback shift registers and exclusive-OR gates can be used in accordance with well known test techniques.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a mixed signal integrated circuit with self test capability, comprising:

a plurality of power electrodes to convey DC power at one or more source voltages;

a plurality of input signal electrodes to convey a plurality of input signals including one or more digital input signals and one or more analog input signals;

a plurality of output signal electrodes to convey a plurality of output signals including one or more digital output signals and one or more analog output signals;

digital circuitry coupled, at least in part, to said pluralities of power, input signal and output signal electrodes, and responsive, during a plurality of substantially mutually exclusive time intervals, to at least a portion of said plurality of input signals and one or more test signals by selectively processing said at least a portion of said plurality of input signals and said one or more test signals, and selectively providing one or more control signals and at least a portion of said plurality of output signals including one or more result signals related to said one or more test signals; and analog circuitry coupled, at least in part, to said pluralities of power, input signal and output signal electrodes, and to at least a portion of said digital circuitry, and responsive to at least another portion of said plurality of input signals and said one or more control signals by selectively processing said at least another portion of said plurality of input signals and said one or more control signals and selectively providing at least another portion of said plurality of output signals and said one or more test signals.

2. The apparatus of claim 1, wherein:

a first portion of said digital circuitry is responsive to a first portion of said plurality of input signals by selectively processing said first portion of said plurality of input signals and selectively providing a first portion of said plurality of output signals; and a second portion of said digital circuitry is responsive, during said plurality of substantially mutually exclusive time intervals, to a second portion of said plurality of input signals and said one or more test signals by selectively processing said second portion of said plurality of input signals and said one or more test signals, and selectively providing said one or more control signals and a second portion of said plurality of output signals including said one or more result signals.

3. The apparatus of claim 1, wherein:

said plurality of substantially mutually exclusive time intervals comprises first and second sequential time intervals; and said digital circuitry is responsive to said one or more test signals during said first time interval and to said at least a portion of said plurality of input signals during said second time interval by selectively processing said at least a portion of said plurality of input signals and said one or more test signals, and selectively providing said one or more control signals and said at least a portion of said plurality of output signals.

4. The apparatus of claim 3, wherein said first time interval substantially immediately follows an initial reception of said DC power.

5. The apparatus of claim 1, wherein said digital circuitry comprises a read only memory.

6. The apparatus of claim 1, wherein said digital circuitry comprises a programmable logic array.

7. The apparatus of claim 1, wherein said digital circuitry comprises programmable array logic.

8. The apparatus of claim 1, wherein said digital circuitry comprises a multilevel gate array.

9. The apparatus of claim 1, wherein said digital circuitry is responsive, during said plurality of substantially mutually exclusive time intervals, to said at least a portion of said plurality of input signals and said one or more test signals by selectively processing, during said plurality of substantially mutually exclusive time intervals, said at least a portion of said plurality of input signals and said one or more test signals, and selectively providing said one or more control signals and said at least a portion of said plurality of output signals including said one or more result signals related to said one or more test signals.

10. The apparatus of claim 9, wherein:
a first portion of said digital circuitry is responsive to a first portion of said plurality of input signals by selectively processing said first portion of said plurality of input signals and selectively providing a first portion of said plurality of output signals; and
a second portion of said digital circuitry is responsive to a second portion of said plurality of input signals and said one or more test signals by selectively processing, during said plurality of substantially mutually exclusive time intervals, said second portion of said plurality of input signals and said one or more test signals, and selectively providing said one or more control signals and a second portion of said plurality of output signals including said one or more result signals.

11. The apparatus of claim 9, wherein:
said plurality of substantially mutually exclusive time intervals comprises first and second sequential time intervals; and
said digital circuitry is responsive to said at least a portion of said plurality of input signals and said one or more test signals by selectively processing said one or more test signals during said first time interval and said at least a portion of said plurality of input signals during said second time interval, and selectively providing said one or more control signals and said at least a portion of said plurality of output signals.

12. The apparatus of claim 11, wherein said first time interval substantially immediately follows an initial reception of said DC power.

13. The apparatus of claim 9, wherein said digital circuitry comprises a read only memory.

14. The apparatus of claim 9, wherein said digital circuitry comprises a programmable logic array.

15. The apparatus of claim 9, wherein said digital circuitry comprises programmable array logic.

16. The apparatus of claim 9, wherein said digital circuitry comprises a multilevel gate array.

17. The apparatus of claim 1, wherein said digital circuitry is responsive, during said plurality of substantially mutually exclusive time intervals, to said at least a portion of said plurality of input signals and said one or more test signals by selectively processing said at least a portion of said plurality of input signals and said one or more test signals, and selectively providing, during said plurality of substantially mutually exclusive time intervals, said one or more control signals and said at least a portion of said plurality of output signals including said one or more result signals related to said one or more test signals.

18. The apparatus of claim 17, wherein:
a first portion of said digital circuitry is responsive to a first portion of said plurality of input signals by selectively processing said first portion of said plurality of input signals and selectively providing a first portion of said plurality of output signals; and
a second portion of said digital circuitry is responsive to a second portion of said plurality of input signals and said one or more test signals by selectively processing said second portion of said plurality of input signals and said one or more test signals, and selectively providing, during said plurality of substantially mutually exclusive time intervals, said one or more control signals and a second portion of said plurality of output signals including said one or more result signals.

19. The apparatus of claim 17, wherein:
said plurality of substantially mutually exclusive time intervals comprises first and second sequential time intervals; and
said digital circuitry is responsive to said at least a portion of said plurality of input signals and said one or more test signals by selectively processing said at least a portion of said plurality of input signals and said one or more test signals, and selectively providing, during said first time interval, said one or more control signals and a first portion of said plurality of output signals including said one or more result signals, and selectively providing, during said second time interval, a second portion of said plurality of output signals.

20. The apparatus of claim 19, wherein said first time interval substantially immediately follows an initial reception of said DC power.

21. The apparatus of claim 17, wherein said digital circuitry comprises a read only memory.

22. The apparatus of claim 17, wherein said digital circuitry comprises a programmable logic array.

23. The apparatus of claim 17, wherein said digital circuitry comprises programmable array logic.

24. The apparatus of claim 17, wherein said digital circuitry comprises a multilevel gate array.

25. The apparatus of claim 1, wherein said digital circuitry is responsive, during said plurality of substantially mutually exclusive time intervals, to said at least a portion of said plurality of input signals and said one or more test signals by, during said plurality of substantially mutually exclusive time intervals, selectively processing said at least a portion of said plurality of input signals and said one or more test signals, and selectively providing said one or more control signals and said at least a portion of said plurality of output signals including said one or more result signals related to said one or more test signals.

26. The apparatus of claim 25, wherein:
a first portion of said digital circuitry is responsive to a first portion of said plurality of input signals by selectively processing said first portion of said plurality of input signals and selectively providing a first portion of said plurality of output signals; and a second portion of said digital circuitry is responsive to a second portion of said plurality of input signals and said one or more test signals by, during said plurality of substantially mutually exclusive time intervals, selectively processing said second portion of said plurality of input signals and said one or more test signals, and selectively providing said one or more control signals and a second portion of said plurality of output signals including said one or more result signals.

27. The apparatus of claim 25, wherein:

said plurality of substantially mutually exclusive time intervals comprises first and second sequential time intervals; and said digital circuitry is responsive to said at least a portion of said plurality of input signals and said one or more test signals during said first time interval, by selectively processing said one or more test signals and selectively providing said one or more control signals and a first portion of said plurality of output signals including said one or more result signals, and during said second time interval, by selectively processing said at least a portion of said plurality of input signals and selectively providing a second portion of said plurality of output signals.

28. The apparatus of claim 27, wherein said first time interval substantially immediately follows an initial reception of said DC power.

29. The apparatus of claim 25, wherein said digital circuitry comprises a read only memory.

30. The apparatus of claim 25, wherein said digital circuitry comprises a programmable logic array.

31. The apparatus of claim 25, wherein said digital circuitry comprises programmable array logic.

32. The apparatus of claim 25, wherein said digital circuitry comprises a multilevel gate array.

* * * * *

UNITED STATES PATENT AND TRADEMARK OFFICE
CERTIFICATE OF CORRECTION

PATENT NO. : 7,315,177 B1  Page 1 of 1
APPLICATION NO. : 10/997310
DATED : January 1, 2008
INVENTOR(S) : Ulrich Seif It is certified that error appears in the above-identified patent and that said Letters Patent is hereby corrected as shown below:

At column 5, line 28, please delete "102de. The BIST results monitor 102de" and insert --102dc. The BIST results monitor 102dc--;

At column 5, line 31, please delete "102de" and insert --102dc--;

At column 5, line 35, please delete "tot" and insert --to--;

At column 5, line 35, please delete "102de" and insert --102dc--.

Signed and Sealed this

Twenty-ninth Day of April, 2008

JON W. DUDAS
*Director of the United States Patent and Trademark Office*